United States Patent
Bourquin et al.

(10) Patent No.: US 6,469,489 B1
(45) Date of Patent: Oct. 22, 2002

(54) ADAPTIVE ARRAY SENSOR AND ELECTRICAL CIRCUIT THEREFORE

(75) Inventors: Stéphane Bourquin, Zurich (CH); Peter Seitz, Urdorf (CH)

(73) Assignee: CSEM Centre Suisse d'Electronique et de Microtechnique SA, Neuchatel (CH)

( * ) Notice: Subject to any disclaimer, the term of this patent is extended or adjusted under 35 U.S.C. 154(b) by 0 days.

(21) Appl. No.: 09/604,951

(22) Filed: Jun. 27, 2000

(30) Foreign Application Priority Data

Jul. 2, 1999 (EP) .......................... 98 810 572

(51) Int. Cl.$^7$ .......................... G01R 31/00; H01L 27/00
(52) U.S. Cl. ...................... 324/96; 250/208.1
(58) Field of Search .................. 324/96, 76.36; 250/208.1, 370.09, 288, 214.01

(56) References Cited

U.S. PATENT DOCUMENTS

| | | | | |
|---|---|---|---|---|
| 4,029,976 A | * | 6/1977 | Fish et al. | 327/514 |
| 5,140,162 A | * | 8/1992 | Stettner | 250/370.09 |
| 5,286,968 A | * | 2/1994 | Fournier et al. | 250/208.1 |
| 5,376,813 A | | 12/1994 | Delbruck et al. | |
| 5,856,667 A | * | 1/1999 | Spring et al. | 250/208.1 |

FOREIGN PATENT DOCUMENTS

| | | |
|---|---|---|
| DE | 44 40 613 C1 | 11/1994 |
| EP | 0 564 349 A1 | 3/1993 |
| FR | 2 664 048 | 6/1990 |
| JP | 56169443 | 12/1981 |
| JP | 61212127 | 9/1986 |

OTHER PUBLICATIONS

T. Spirig, P. Seitz, O. Vietze, F. Heitger; The Lock–In CCD—Two–Dimensional Synchronous Detection of Light; Journal of Quantum Electronics, vol. 31, No. 9, Sep. 1995.
A standard photodiode active pixel image sensor. Chapter 3.
E.A. Swanson, D. Huang, M.R. Hee, and J.G. Fujimoto, C.P. Lin and C.A. Puliafito; High–speed optical coherence domain reflectometry; Optics Letters, Jan. 15, 1992/ vol. 17, No. 2.
G.J. Tearney, B.E. Bouman, S.A. Boppart and B. Golubovic, E.A. Swanson, J.G. Fujimoto; Rapid asquisition of in vivo biological images by use of optical coherence tomography, Optics Letter, vol. 21, No. 17, Sep. 1, 1996.
E. Zimmermann, Y. Salvade, and R. Danliker; Stabilized three–wavelength source calibrated by electronic means for high–accuracy absolute distance measurement.

* cited by examiner

Primary Examiner—Michael Sherry
Assistant Examiner—Paresh Patel
(74) Attorney, Agent, or Firm—Oppedahl & Larson LLP

(57) ABSTRACT

The on-chip electrical circuit (1) for the detection of modulated signals (I), e.g., light, comprises sensor means (PS), e.g., a photosensor, and feedback means (FB) including a low-pass frequency filter. The circuit (1) further comprises a voltage-controlled current source (CS), the input of which is connected to the output of the feedback means (FB) and the output of which is connected in series with the photosensor (PS) in a common node. The common node is connected to the input of an amplifier (AMP). The output of the amplifier (AMP) may be connected to a rectifier (RF), followed by a low-pass filter (LPF). A plurality of such electrical detection circuits (1) with parallel outputs can form a one-dimensional or two-dimensional array sensor for the coherent or heterodyne analog detection of intensity modulated optical signals simultaneously for all pixels with a high dynamic range. The array sensor may be used, e.g., in single or multiple wavelength interferometry, and especially in optical low-coherence tomography.

14 Claims, 5 Drawing Sheets

ADAPTIVE ARRAY SENSOR AND ELECTRICAL CIRCUIT THEREFORE

The invention relates to an adaptive array sensor for a pixel-parallel detection of modulated signals with a high dynamic range, to an on-chip electrical circuit therefor, and to a method for adaptively detecting a modulated signal. The signals to be detected are, e.g., coherent or heterodyne analog intensity modulated optical signals. The invention is especially well adapted to the fields of optical measurement technique where it is required to detect the amplitude of a small light intensity modulation superimposed on a high slow-moving background. This is usually the case in interferometric methods, for example single or multiple wavelength interferometry, and especially optical low-coherence tomography (OLCT).

BACKGROUND OF THE INVENTION

An example of multiple wavelength interferometry is disclosed in E. Zimmermann, Y. Salvadé, and R. Dändliker, "Stabilized three-wavelength source calibrated by electronic means for high-accuracy absolute distance measurement", Opt. Lett. 21 (7), 531 (1996). Principle and examples of OLCT are given in, e.g., E. A. Swanson et al., "High-Speed optical coherence domain reflectometry", Optics Letters 17 (2), pp 151–153, 1992 or in G. J. Tearney, B. E. Bouma, S. A Boppart, B. Golubovic, E. A Swanson, J. G. Fujimoto, "Rapid acquisition of in vivo biological images by use of optical coherence tomography", Opt. Lett., Vol. 21 (17), 1408 (1996).

The related art concerns array sensors which perform detection sampling and demodulation of a periodic signal of known frequency, using a CCD (e.g., FR-2 664 048) or a lock-in CCD (e.g., DE-44 40 613). An off-chip electrical or software signal conditioning is necessary to obtain the information on the amplitude modulation. The disadvantages of such techniques are the following:

- It is necessary to know the frequency of the modulation signal exactly.
- It is necessary to perform a substantial amount of signal post-processing to extract the envelope of the intensity modulation. This increases also the overall measurement time and system complexity.
- The use of standard CCD devices limits the carrier frequency of the optical signal to detect due to the frame rate of the sensor. Indeed, it is necessary to acquire more than two samples per period of the carrier frequency to obtain the amplitude of the modulation. This means that the frame rate has to be more than two times faster than the carrier frequency.
- The background of light limits the dynamic range of standard CCD image sensors.

This invention overcomes all these disadvantages by providing pixel circuitry with an adaptive feedback loop.

An AC amplifier circuit with a feedback loop has already been described in U.S. Pat. No. 5,376,813. It concerns an adaptive photoreceptor semiconductor circuit for long-time-constant continuous adaptation. The principle is based on a source follower receptor with feedback loop for adaptation of slow changes of background light. This circuit was developed to be used for time-domain image processing, for example, motion computation. It is useful in systems that care about the contrast change in an image, and not the absolute intensities. However, the use of the source follower principle for the detection stage has the disadvantage of placing a low impedance in series with the photodiode. This means that the AC transimpedance gain is small.

The invention aims at providing an on-chip electrical circuit for the adaptive detection of modulated signals which does not suffer from the above disadvantages. The invention further aims at providing a one-dimensional or a two-dimensional adaptive array sensor comprising a plurality of such circuits.

SUMMARY OF THE INVENTION

The electrical circuit according to the invention comprises sensor means for transducing an input signal into an electrical signal, amplifier means with an input and an output, and feedback means with an input and an output, the input being connected to the output of the amplifier means. The feedback means include frequency filter means for passing electrical signals modulated with frequencies within a selected frequency range and for blocking electrical signals modulated with frequencies out of the selected frequency range. The circuit further comprises a current source with an input and an output, its output current being controlled by an electrical input signal, the input being connected to the output of the feedback means and the output being connected in series with the sensor means in a common node. The common node of the current source and the sensor means is connected to the input of the amplifier means.

The AC transimpedance gain of the electrical circuit according to the invention is larger than with a source follower. The electrical circuit according to the invention is also more adapted for high gain AC amplification, and the change of the AC gain as a function of the DC level of the input signal is smaller than with the circuit according to U.S. Pat. No. 5,376,813. The presented invention preferably concerns also a whole circuit for amplitude demodulation, which is not the case for the circuit described in U.S. Pat. No. 5,376,813. No additional signal processing is necessary; indeed, the wanted information, i.e., the amplitude of the modulation, is directly and simultaneously readable at any desired time at the output of the circuit.

Intrinsically, the frequency range of the circuit according to the invention is not limited; typical modulation frequencies to be detected are between 1 kHz and 1 GHz.

The method for adaptively detecting a modulated signal according to the invention comprises the steps of transducing the signal into a first electrical signal, amplifying a second electrical signal including the first electrical signal, and using a part of the amplified electrical signal for a feedback. The part of the amplified electrical signal used for a feedback is frequency filtered so that electrical signals modulated with frequencies within a selected frequency range are passed and electrical signals modulated with frequencies out of the selected frequency range are blocked. The filtered electrical signals control a third electrical signal, and before amplification, the first electrical signal is combined with the third electrical signal, thus yielding the second electrical signal.

The invention also relates to a (one- or two-dimensional) array sensor which contains a multitude of similar or identical circuits according to the invention, with parallel outputs. This sensor with "smart pixels" allows one to perform coherent or heterodyne detection of modulated signals simultaneously, in parallel for all pixels. The array sensor has a high dynamic range and, in the case of an optical sensor, a performance close to the shot noise limit of the light. The feedback loop of each circuit compensates for any imperfection or discrepancy on the array-sensor chip; such imperfections are inevitable and deteriorate the performance of a sensor according to the state of the art. The array sensor according to the invention may use the analog heterodyne or coherent detection method. In this case, "analog" means without sampling of the carrier frequency. In comparison with the direct-detection method, the heterodyne detection has the following advantages:

it is insensitive to unwanted background light with which the local oscillator does not mix;

heterodyning is one of the few ways of attaining photon-noise-limited detection in the infrared, where background noise is so prevalent.

The array sensor and the electrical circuit according to the invention can be used for any input signals such as electromagnetic, ultrasonic or chemical signals. However, in the following, the invention is discussed for the example of an optical signal.

DESCRIPTION OF THE DRAWINGS

The invention is described in greater detail hereinafter relative to the attached schematic drawings.

DETAILED DESCRIPTION

Figure 1:
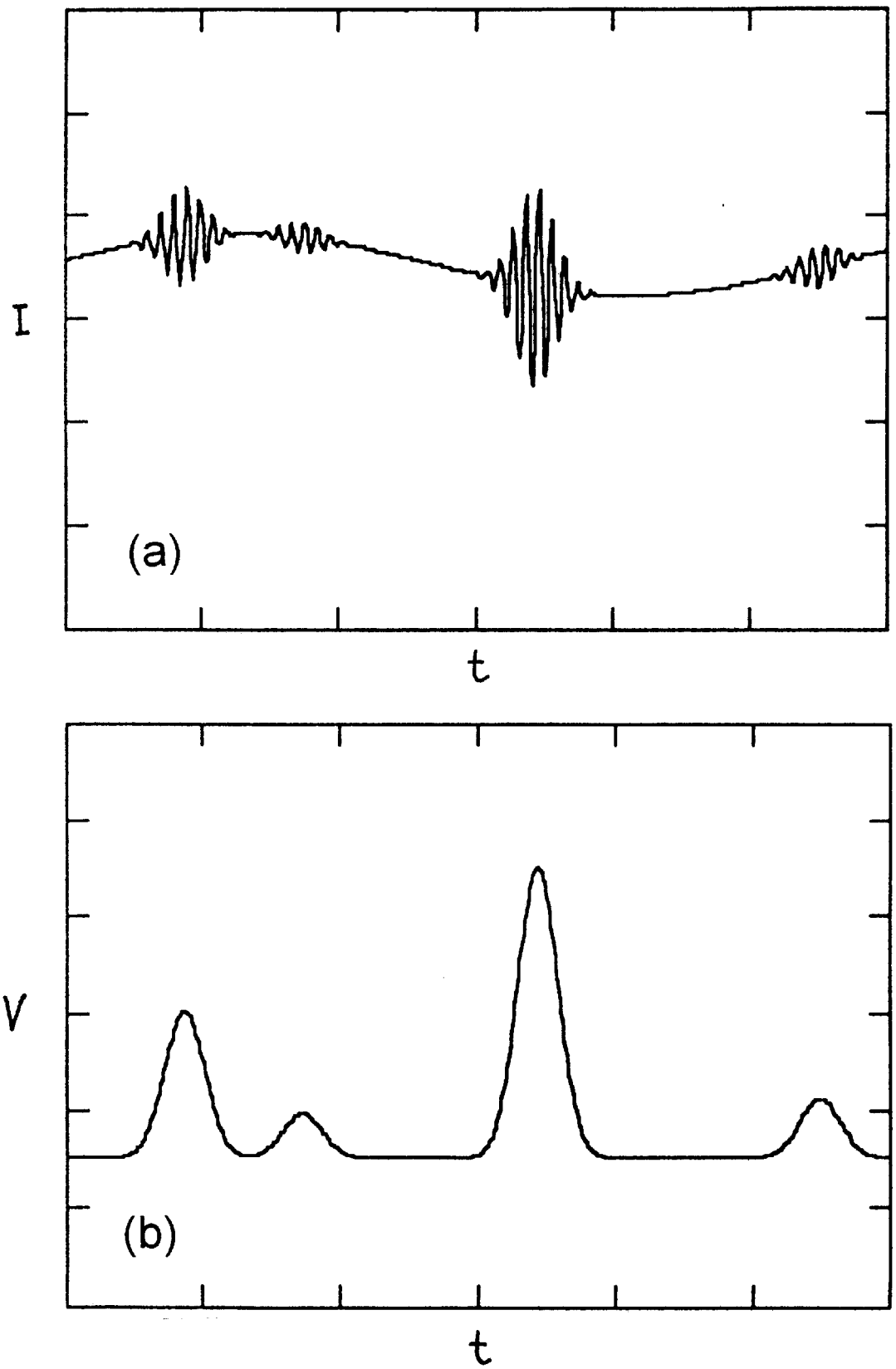
FIG. 1 shows (a) a typical light intensity modulated signal reaching a pixel of a sensor, and (b) the desired electrical signal at the sensor output.

FIG. 1(a) shows a typical modulated input signal I, e.g., a light intensity, vs. time t, reaching a pixel of a sensor. The signal I is a superposition of a small light intensity modulation on a high slow-moving background. In many applications such as single or multiple wavelength interferometry and especially optical low-coherence tomography (OLCT), the amplitude of the small signal is of interest, whereas the background signal is not. The sensor output signal V, vs. time t, desired in such applications is schematically shown in FIG. 1(b).

Figure 2:
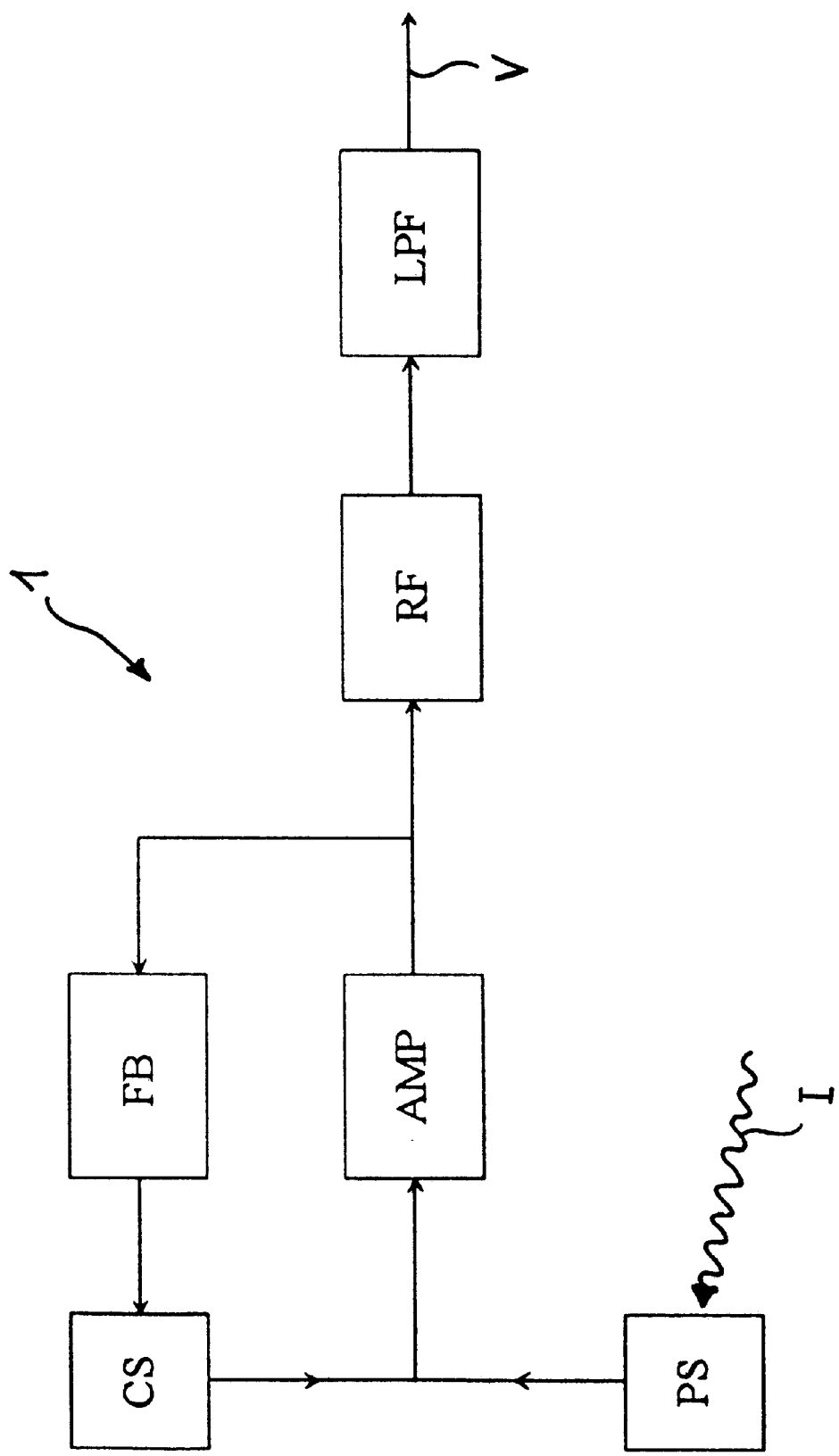
FIG. 2 shows a block diagram of a sensor circuit according to the invention.

FIG. 2 shows a block diagram of a circuit 1 designed for one pixel of the array sensor according to the invention. The circuit comprises a sensor, eg., a photosensor PS, an amplifier AMP, a feedback FB, a current source CS, a rectifier RF and a low-pass filter LPF. An input signal I to be sensed, e.g., intensity modulated light, reaches the photosensor PS, is processed in the circuit 1 and is put out as an electrical output signal V at the output of the low-pass filter LPF.

Figures 3, 4, 5, 6:
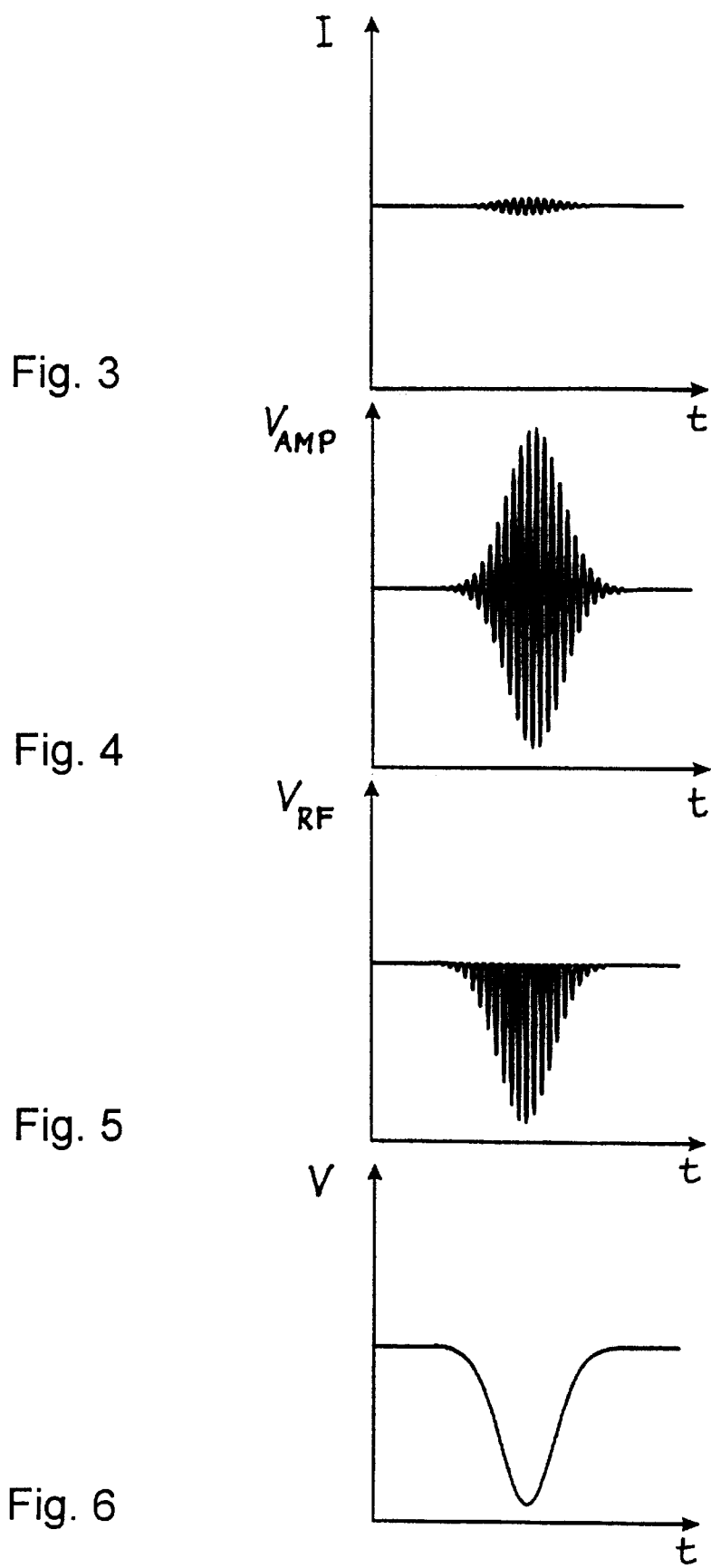
FIG. 3 shows the intensity of an optical signal vs. time.
FIG. 4 shows the electrical signal at the output of an amplifier in the circuit of FIG. 2 vs. time.
FIG. 5 shows the electrical signal at the output of a rectifier in the circuit of FIG. 2 vs. time.
FIG. 6 shows the electrical signal at the output of the circuit of FIG. 2 vs. time.

The signal I to detect is typically composed of a small intensity modulation on a high slow-moving background, e.g., of light, as shown in FIG. 3 vs. time t. The following processing is performed to obtain the time-dependent amplitude of this modulation: signal detection, amplification of the signal at the carrier frequency and extraction of the envelope. These steps will be explained in detail with reference to FIGS. 2 and 3–6.

The light signal I shown in FIG. 3 is detected by a photosensor PS, which converts the incident photon flux into an electrical current. This photosensor is connected in series to a voltage controlled current source CS. The resulting current which is the difference between the current set by the current source and the current flowing through the photodiode is amplified by the AMP block. The signal at the output of the amplifier is sent back to the FB block, which controls the current source. The tasks of the feedback loop are to keep the amplifier at its operating point and to select the frequency range to amplify. Typical circuits for the feedback can be a low-pass filter followed by a PID (proportional, integral, derivative) regulation circuit. The low-pass filter sets the cut-off frequency of amplified frequencies. Indeed, when the optical signal reaching the photodiode is modulated with a carrier frequency smaller than the cut-off frequency, the low-pass filter is transparent to this carrier frequency and the feedback loop is closed. This means that this variation is fully compensated by the integrator and current source that follow and the current is kept constant at the input of the amplifier AMP. In this case the gain at frequencies smaller than the cut-off frequency is zero or near zero. When the optical signal reaching the photodiode is modulated with a carrier frequency higher than the cut-off frequency of the low-pass filter, the filter suppresses this carrier frequency and the feedback loop is open. This means that this frequency is not compensated by the integrator, but amplified with a gain given by AMP. The PID allows one to adjust the compensation speed of the correction signal to apply to the current source in such a way that it is done as fast as possible without loop oscillations.

The modulated signal $V_{AMP}$ at the output of the amplifier AMP (FIG. 4) is rectified by the block RF. It can be a full-wave rectifier, which uses both sides of the AC signal, or a half-wave rectifier, which cuts one of the signs, as shown in FIG. 5. The output signal $V_{RF}$ of the rectifier RF is then filtered by the block LPF, which typically is a low-pass filter. The cut-off frequency of this block is chosen such that it removes the carrier frequency of the rectified signal. The signal V at the output of the low-pass filter LPF is shown in FIG. 6.

The electrical circuits such as shown in FIG. 2 may be used in many ways.

This circuit can be used alone in a one-channel system.

Figure 7:
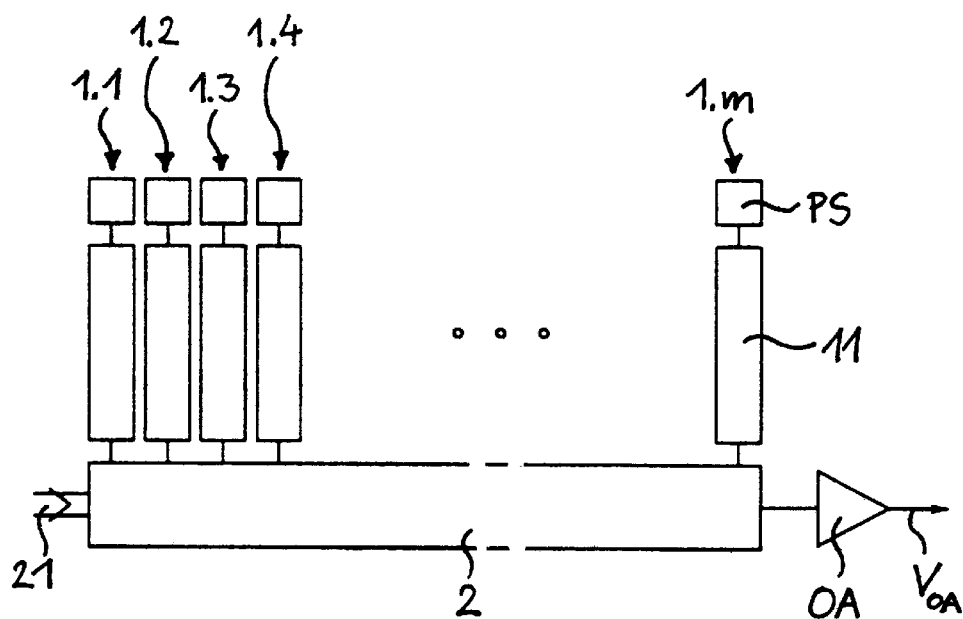
FIG. 7 shows a one-dimensional arrangement of circuits according to the invention.

A multitude of such circuits 1.1, 1.2, . . . , 1.m can be stacked in one line (1D array), as shown in FIG. 7. Each of the circuits 1.1, 1.2, . . . , 1.m consists of a photosensor PS and electronic circuitry 11 comprising the components AMP, FB, CS, RF and LPF described with reference to FIG. 2. One possibility consists of realizing the same number m of outputs as there are circuits. However, if there is a high number m of such circuits, it is better to use an address decoder 2, which allows addressing all the outputs of these circuits either serially or to select one or more given circuit outputs by indicating the corresponding pixel addresses 21. The address decoder 2 is followed by an output amplifier OA, which yields an output signal $V_{OA}$.

Figure 8:
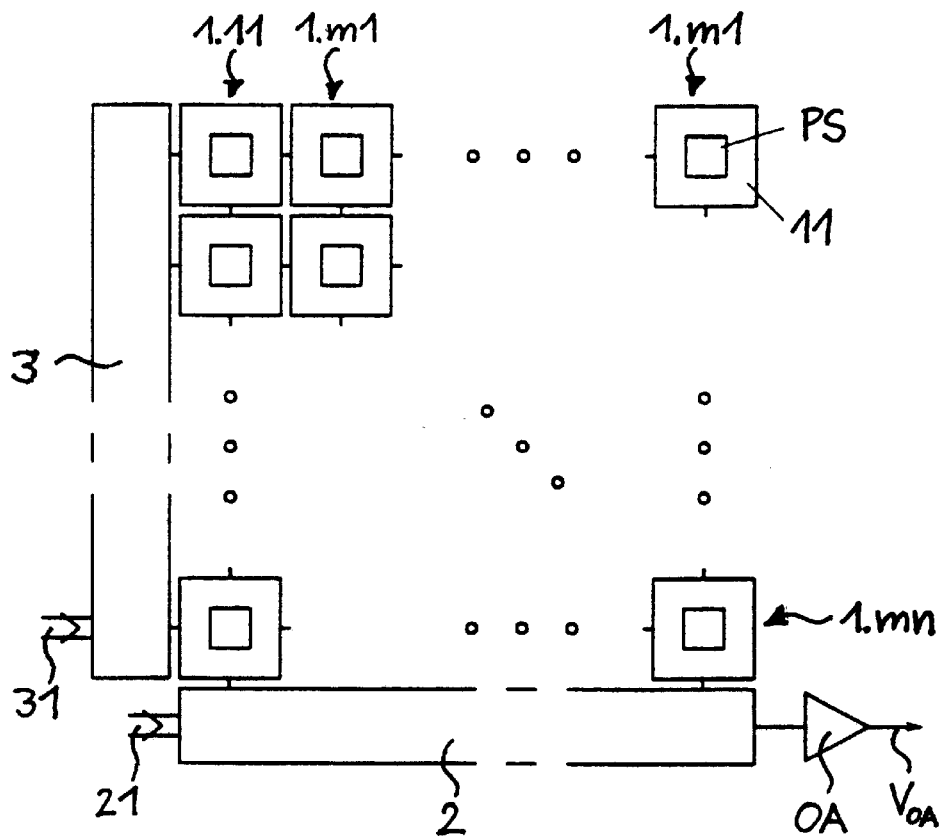
FIG. 8 shows a two-dimensional arrangement of circuits according to the invention.

A multitude of such circuits 1.11, 1.12, . . . , 1.mn can be stacked in a 2D array, as shown in FIG. 8. As above, it is possible to realize one output per circuit, or to implement a column address decoder 2 and a row address decoder 3 to select one circuit after the other, or a group of circuit outputs at the same time, by indicating the corresponding column addresses 21 and row addresses 31.

The address decoders 2, 3 are used to read out the outputs of each circuit 1.1, ..., 1.m; 1.11, ..., 1.mn serially. Their electrical schematic is known art and is therefore not described here. However, there is a full description in O. Vietze, "Active pixel image sensors with application specific performance based on standard silicon CMS processes", thesis ETHZ No. 12'038, pp 47–61, 1997, which is incorporated herein by reference.

It should be noted that in a 2D sensor according to the invention, the circuits 1.11, ..., 1.mn may be arranged in a different way than in rows and columns as shown in FIG. 8. Any kind of arrangement falls within the scope of the invention.

Figure 9:
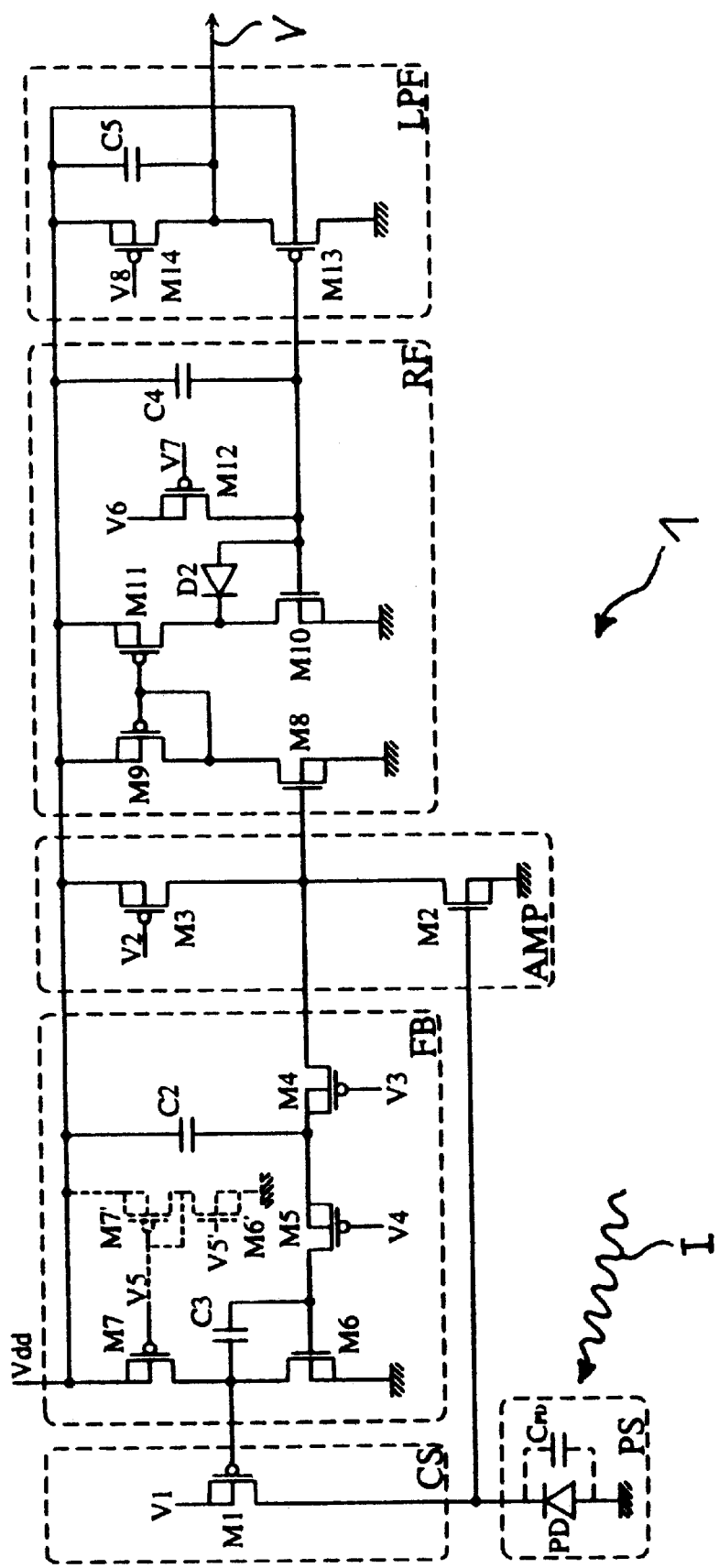
FIG. 9 shows details of an embodiment of the sensor circuit according to the invention.

In the following, one realization possibility of the electrical circuit 1 according to the invention is described with reference to FIG. 9. In this case, the design of the circuit is based on a CMOS N-well technology. Nevertheless, there are a lot of other design possibilities for these same functionalities. V1 to V8 denote external voltages with which the circuit's properties can be tuned; for a certain application, they normally have fixed values.

The photosensor PS used is a photodiode device PD. The anode is connected to the ground. The photocurrent $I_{PD}$ flowing through the diode PD is proportional to the incident modulated light intensity I. The intrinsic capacity $C_{PD}$ of the photodiode PD converts this current $I_{PD}$ into a voltage U, according to the formula $$U = \frac{1}{C_{PD}} \int I_{PD} \cdot dt.$$

The current source CS is realized with a PMOS transistor M1. Its drain is connected to the cathode of the photodiode and its source to a constant voltage V1. The bulk node is connected to the source. The current flowing through the transistor is set by the gate-source voltage. The constant source voltage V1 allows to adapt the current source device to the range of the voltage coming from the feedback FB and applied on the gate of M1 in such a way that the current flowing through the current source is of the same order as the current flowing through the photodiode. For small currents (<10 nA), the transistor is working in the subthreshold mode and the current is an exponential function of the gate-source voltage. For higher currents (>10 nA), the transistor works over the threshold voltage and it is in saturation mode. The current is then proportional to the square of the gate-source voltage.

The amplifier AMP consists of an inverter amplifier. It contains one NMOS transistor M2 and one load PMOS transistor M3. The cathode of the photodiode is connected to the gate of M2. The source of M2 is connected to the ground and the drain is linked to the drain of M3, which corresponds to the output node of the amplifier. The source of M3 is set to a fixed voltage Vdd. Both bulk nodes are connected to their respective source nodes. The bias voltage V2 applied on the gate of M3 sets the current flowing in the amplifier AMP. It allows to find a compromise between high gain and slow speed (V2 close to Vdd) or small gain and high speed (V2 close to the ground). The amplifier AMP may be a linear or a logarithmic amplifier; a logarithmic amplifier yields an even better dynamic range.

The feedback FB used in this circuit is a low-pass filter followed by an integrator. The low-pass filter contains a first order RC cell M4 PMOS transistor as resistance and C2 as capacitance). The drain of M4 is connected to the output of the amplifier AMP. C2 is connected between the source of M4 and a fixed voltage, Vdd in this case. The cut-off frequency $f_{lp}$ of the low-pass filter is given by an intrinsic resistance $R_{M4}$ and C2 and is equal to $$f_{lp} \cong 1/(2\pi R_{M4} C2).$$

For carrier frequencies smaller than $f_{lp}$ the amplification gain is zero or near zero. For carrier frequencies higher than $f_{lp}$ the amplification gain is determined by the transimpedance gain due to the intrinsic capacitance of the photodiode PD and the resistance of the current source CS, and also by the gain of the amplifier AMP. The integrator contains a differential amplifier (M6, M6' NMOS transistors, and M7, M7' PMOS transistors), a resistance $R_{M5}$ realized with a PMOS transistor M5 and a capacitance C3. This differential amplifier is a differential pair loaded by a current mirror. The differential pair consists of two matched NMOS transistors (M6 and M6'). The current mirror consists of two matched PMOS transistors (M7 and M7'). The resistance $R_{M5}$ is connected between the output of the low-pass filter (drain of M5) and the negative input of the differential amplifier. C3 is connected into the negative feedback of the differential amplifier. The time constant τi of the integrator allows adjustment of the speed of the compensation and to prevent oscillations in the loop. It is set by the adjustable resistance $R_{M5}$ and the capacity C3 by $$\tau i = R_{M5} C3.$$

In the case of the realization of a multitude of such electrical circuits, the positive part of the differential amplifier (M6' and M7' represented lines in FIG. 9) has to be realized only once, common for all circuits. The voltage V5' sets the working point of the system. Indeed, it is stabilized when the difference between the gate voltage of M6 and V5' is zero. The sources and bulks of the two resistances NMOS transistors are connected together in order to simplify the layout (for the N-well technology).

The rectifier RF used is a half-wave rectifier. It contains a differential amplifier (M8, M10, NMOS transistors and M9, M11 PMOS transistors), a diode D2 and a resistance realized with a PMOS transistor M12. The input signal is injected into the gate of M8, which is the positive input of the differential amplifier. This amplifier is a differential pair loaded by a current mirror. The differential pair consists of two matched NMOS transistors (M8 and M10). The current mirror consists of two matched PMOS transistors (M9 and M11). The diode D2 is placed into the negative feedback loop, with the anode connected to the negative input of the differential amplifier and the cathode to the output of the differential amplifier. This configuration has the advantage of suppressing the threshold voltage of the diode. The resistance realized with the PMOS transistor M12 is connected between the negative input of the differential amplifier and a bias voltage V6. The latter sets the offset voltage where the input signal is rectified. Indeed, when the input voltage (gate of M8) is lower than V6, D2 conducts and the differential amplifier becomes a follower with unity gain. The gate of M10 is set to the same voltage as the input. When the input voltage is higher than V6, D2 is blocked and the gate of M10 is set to V6. The voltage V7 applied on the gate of M12 set the resistance value $R_{M12}$ which determines the rectifier output impedance. All the bulk nodes are connected to their respective source nodes. Additionally, it is possible to place a capacitance C4 between the negative input of the differential amplifier and a fixed voltage, Vdd in the present case. This allows forming a first low-pass filter cell to remove the carrier frequency. The cut-off frequency $f_{lp}'$ is determined by $R_{M12}$ and C4 by $f_{lp}'=1/(2\pi R_{M12}C4)$.

The signal rectified is presented to the negative input of the differential amplifier. It is also possible to implement a full-wave rectifier to decrease the residual ripple. Nevertheless, this solution involves a circuit that requires more floor-space, which is not desirable for stacking in an array.

The low-pass filter LPF is a first order RC cell. It contains a PMOS follower (M13 and M14) and a capacitance C5. The input signal is connected to the gate of M13. The drain of M13 is grounded and the source is connected to the drain of M14. The source of M14 is connected to Vdd. Their bulk node is connected to their respective source node. In this configuration, M14 acts as a voltage controlled resistance load.

The voltage V8 applied to the gate of M14 the resistance value $R_{M14}$. The capacitance C5 is connected between the output of the follower (source of M13 and drain of M14) and a fixed voltage which is Vdd in this case. The signal filtered is present at the output of the follower. The low-pass filter cut-off frequency $f_{lp}''$ is then determined by the resistance $R_{M14}$ and the capacitance C5 by $f_{lp}''=1/(2\pi R_{M14}C5)$.

This cutoff frequency is chosen such that all the half-waves of the carrier frequency are integrated, and that the output signal corresponds to the envelope of the amplitude of this modulation. In the case of an input signal coming from a half-wave rectifier, $R_{M14}$ and C5 can be determined by the following formula:

$$R_{M14} \cdot C5 = \frac{100}{f \cdot rr},$$

where f is the carrier frequency and rr is the residual ripple in percent. Note that it is also possible to use an NMOS follower structure. The choice depends on the input and output voltage range wanted.

It is proposed to use such a 2D array sensor containing these electrical circuits as described above for the photodetection and amplitude demodulation of optical interference fringes in OLCT.

Optical signals in low coherence tomography are typically characterized by small AC modulation of light on top of a slowly-varying background. Since the relevant information is contained in the time-dependent amplitude distribution of the modulation signal, a system is required to extract the envelope of the modulation. Indeed, the amplitude of the modulation is proportional to the intensity of the light reflected by the device under test to a depth given by the time where the signal modulation occurs. Then the record of the envelope of the fringes as a function of time allows acquiring an intensity profile of the light reflected into the device (E. A. Swanson et al., "High-Speed optical coherence domain reflectometry", Opt. Lett. 17 (2), 151 (1992)).

The standard method to acquire a 2D cross-section image or a 3D volume image is to use a transversal scanner in the sample arm of the tomograph and to acquire serially a multitude of longitudinal scans (G. J. Tearney, B. E. Bouma, S. A. Boppart, B. Golubovic, E. A. Swanson, J. G. Fujimoto, "Rapid acquisition of in vivo biological images by use of optical coherence tomography", Opt. Lett., Vol. 21, (17), 1408 (1996)). However, this method needs time to acquire a whole image.

The use of the sensor array according to the invention into a tomograph adapted for this application permits acquiring a 2D (one-line sensor) or 3D (2D sensor) image in only one depth scan, without transverse scanner. This allows decreasing the measurement time and reaching complete tomogram (2D and 3D) acquisition times of several Hertz, also reading and surpassing conventional video frame rates of 25 or 30 Hz. In comparison with the serial tomography systems with transversal scanners, the acquisition time is essentially reduced by the number of photodetectors present in the array sensor.

The use of heterodyne detection allows realizing a tomograph which has a high dynamic range and which is shot noise limited.

What is claimed is:

1. An electrical circuit for the adaptive detection of a modulated signal within a selected modulation frequency range, comprising:
    sensor means for transducing the modulated signal into an electrical signal,
    amplifier means with an input and an output,
    feedback means with an input and an output, the input being connected to the output of the amplifier means, the feedback means including frequency filter means for passing electrical signals modulated with frequencies within a selected frequency range and for blocking electrical signals modulated with frequencies out of the selected frequency range, the frequency filter means comprising a low-pass filter followed by an integrator; and
    a current source with an input and an output, its output current being controlled by an electrical input signal, the input being connected to the output of the feedback means and the output being connected in series with the sensor means in a common node, wherein
    the common node of the current source and the sensor means is connected to the input of the amplifier means.

2. The electrical circuit according to claim 1, wherein the sensor means comprises a photodiode.

3. The electrical circuit according to claim 1, wherein the amplifier means comprises a CMOS inverter amplifier.

4. The electrical circuit according to claim 1, wherein the low-pass filter comprises a capacitor and a PMOS transistor.

5. The electrical circuit according to claim 1, wherein the current source is a PMOS transistor connected between a fixed voltage and the sensor means.

6. The electrical circuit according to claim 1, further comprising rectifier means connected to the output of the amplifier.

7. The electrical circuit according to claim 6, wherein the rectifier means comprises a differential amplifier with a diode connected in the negative feedback, the anode of the diode being connected to the negative input node of the differential amplifier, a PMOS transistor being connected between the negative input of the differential amplifier and a fixed voltage, and the output node of the rectifier being the negative input node of the differential amplifier.

8. The electrical circuit according to claim 6, further comprising a low-pass filter connected to the output of the rectifier.

9. The electrical circuit according to claim 8, wherein the low-pass filter is a PMOS follower with the input connected to the output of the rectifier, a capacitor being connected between the output of the PMOS follower and a fixed voltage.

10. A one-dimensional or two-dimensional adaptive array sensor comprising a plurality of electrical circuits according to claim 1 with parallel outputs.

11. The one-dimensional or two-dimensional array sensor according to claim 10, comprising at least one on-chip address decoder for individually reading out each electrical circuit of a group of electrical circuits.

12. A method for adaptively detecting a modulated signal comprising the steps of;
   transducing the modulated signal into a first electrical signal,
   amplifying a second electrical signal including the first electrical signal,
   using a part of the amplified electrical signal for a feedback, and
   frequency filtering the part of the amplified electrical signal used for a feedback so that electrical signals modulated with frequencies within a selected frequency range are passed and electrical signals modulated with frequencies out of the selected frequency range are blocked by means of a low-pass filter; and,
   integrating the filtered electrical signal, wherein
      the filtered electrical signals control a third electrical signal, and
      before amplification, the first electrical signal is combined with the third electrical signal, thus yielding the second electrical signal.

13. The method according to claim 12, further comprising the steps of rectifying a part of the amplified electrical signal, and frequency filtering the rectified electrical signal.

14. The electrical circuit according to claim 1, wherein said integrator comprises a differential amplifier with a capacitor in the negative feedback and a PMOS transistor connected between the output of the low-pass filter and the negative input of the differential amplifier.

* * * * *